United States Patent [19]

Higurashi

[11] Patent Number: 5,646,559

[45] Date of Patent: Jul. 8, 1997

[54] SINGLE-ELECTRON TUNNELLING LOGIC DEVICE

[75] Inventor: Hitoshi Higurashi, Yokohama, Japan

[73] Assignee: Kabushiki Kaisha Toshiba, Kawasaki, Japan

[21] Appl. No.: 403,444

[22] Filed: Mar. 15, 1995

[30] Foreign Application Priority Data

Mar. 15, 1994 [JP] Japan ................... 6-044334

[51] Int. Cl.$^6$ .................... H01L 29/06; H01L 39/22
[52] U.S. Cl. .................... 326/136; 257/31
[58] Field of Search .................... 257/24, 25, 30; 326/136

[56] References Cited

U.S. PATENT DOCUMENTS

| | | | |
|---|---|---|---|
| 5,075,726 | 12/1991 | Wada | 257/24 |
| 5,401,980 | 3/1995 | Fang et al. | 257/30 |
| 5,420,746 | 5/1995 | Smith | 361/11 |
| 5,422,496 | 6/1995 | Kamohara et al. | 257/24 |

FOREIGN PATENT DOCUMENTS 4-274380  9/1992  Japan .

OTHER PUBLICATIONS

Higurashi et al., "Coulomb Blockade and Current-Voltage Characteristics of Ultrasmall Double".
"Tunnel Junctions with External Circuits", *Physical Review B Condensed Matter* 51(4): 2387–2398, Jan. (1995).

Urbina et al., "Controlled Transfer of Single Charge Carriers", *IEEE Transactions on Magnetics* 27(2):2578–2580 Mar. (1991).

Likharev, K., "Correlated Discrete Transfer of Single Electrons in Ultrasmall Tunnel Junctions", *IBM J. Res. Develop.*, 32(1): 144–158 Jan. (1988).

Grabert et al., "Single Electron Tunneling Rates in Multi-junction Circuits", *Z. Phys. B—Condensed Matter* 84: 143–155, Feb. 25, (1991).

*Primary Examiner*—Edward P. Westin
*Assistant Examiner*—Benjamin D. Driscoll
*Attorney, Agent, or Firm*—Foley & Lardner

[57] ABSTRACT

A stable output can be obtained with respect to the input level fluctuations. Two impedance elements 1 and 2 each having a single-electron tunnel junction are connected in series. The tunnel resistances $R_1$ and $R_2$ and the junction capacitances $C_1$ and $C_2$ of the respective impedance elements 1 and 2 are determined as $R_1 > R_2$ and $C_1 \geq C_2$ or $R_1 < R_2$ and $C_1 \geq C_2$. By this, the charge stored on the island portion 4 can be quantized at a roughly integral value times the prime charge e according to the input voltage, the current-voltage characteristics represent Coulomb staircase, a square-shaped Coulomb oscillation characteristics can be obtained, and a constant output current value to an input voltage range with constant width can be obtained, so that it is possible to widen the voltage margin corresponding to the respective input logical level. A stable output can be obtained against the input voltage fluctuations.

7 Claims, 13 Drawing Sheets

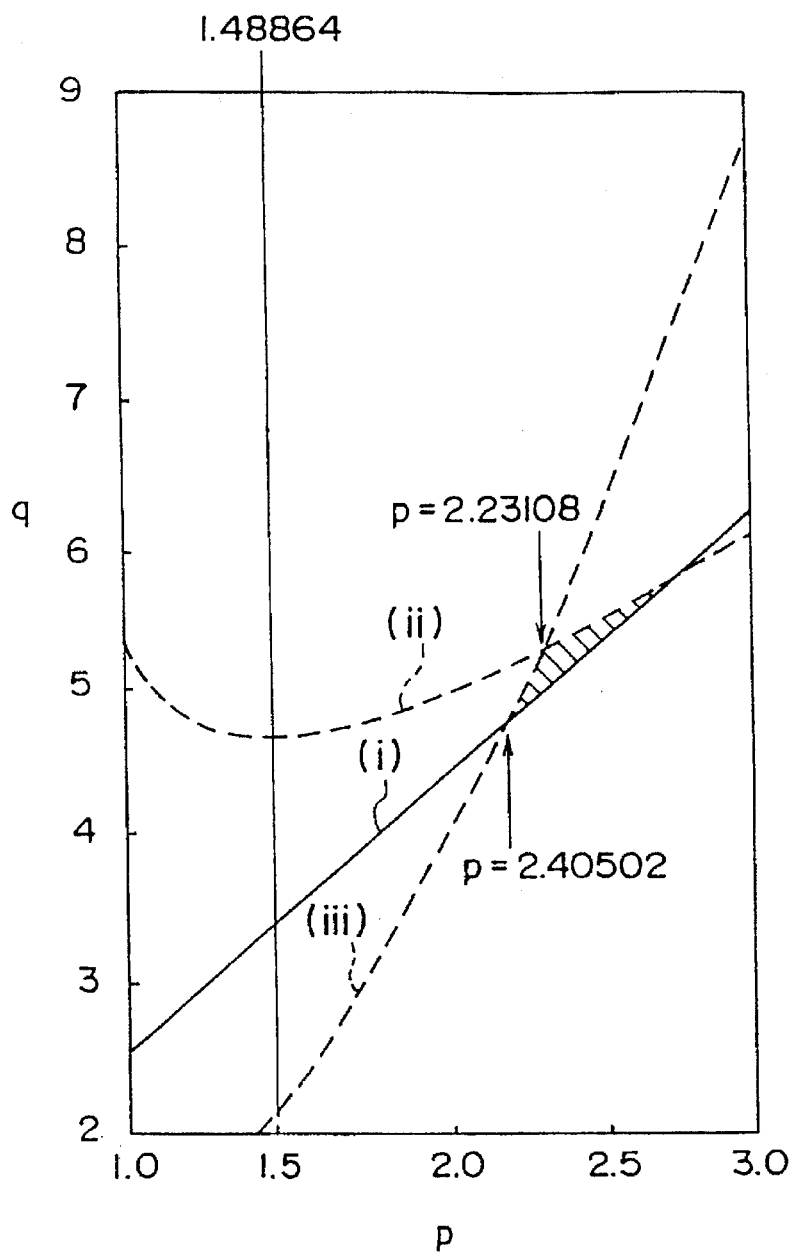
(i) : RIGHT TERM OF EQUATION (37), EQUAL TO OR GREATER THAN $1/q$
(ii) : LEFT TERM OF EQUATION (37), EQUAL TO OR SMALLER THAN $1/q$
(iii) : EQUATION (38)
F I G. 7

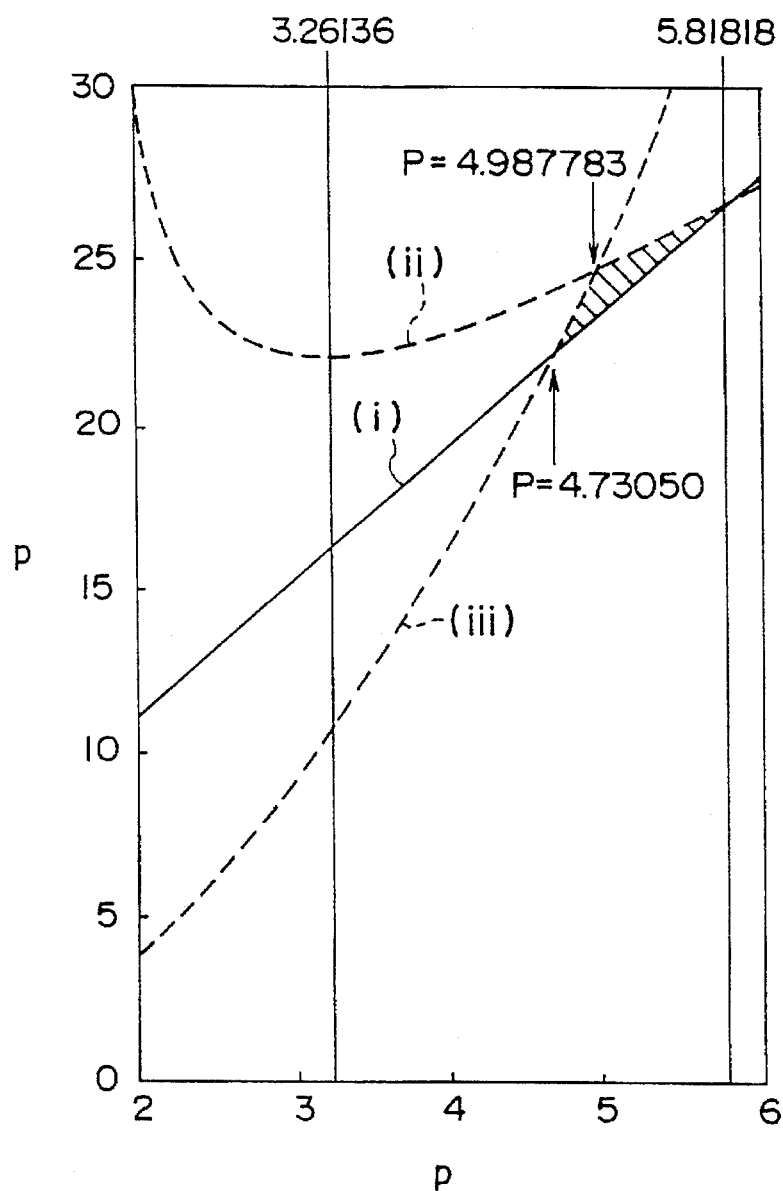
(i) : RIGHT TERM OF EQUATION (55), EQUAL TO OR GREATER THAN $1/q$
(ii) : LEFT TERM OF EQUATION (55), EQUAL TO OR SMALLER THAN $1/q$
(iii) : EQUATION (56)
F I G. 9

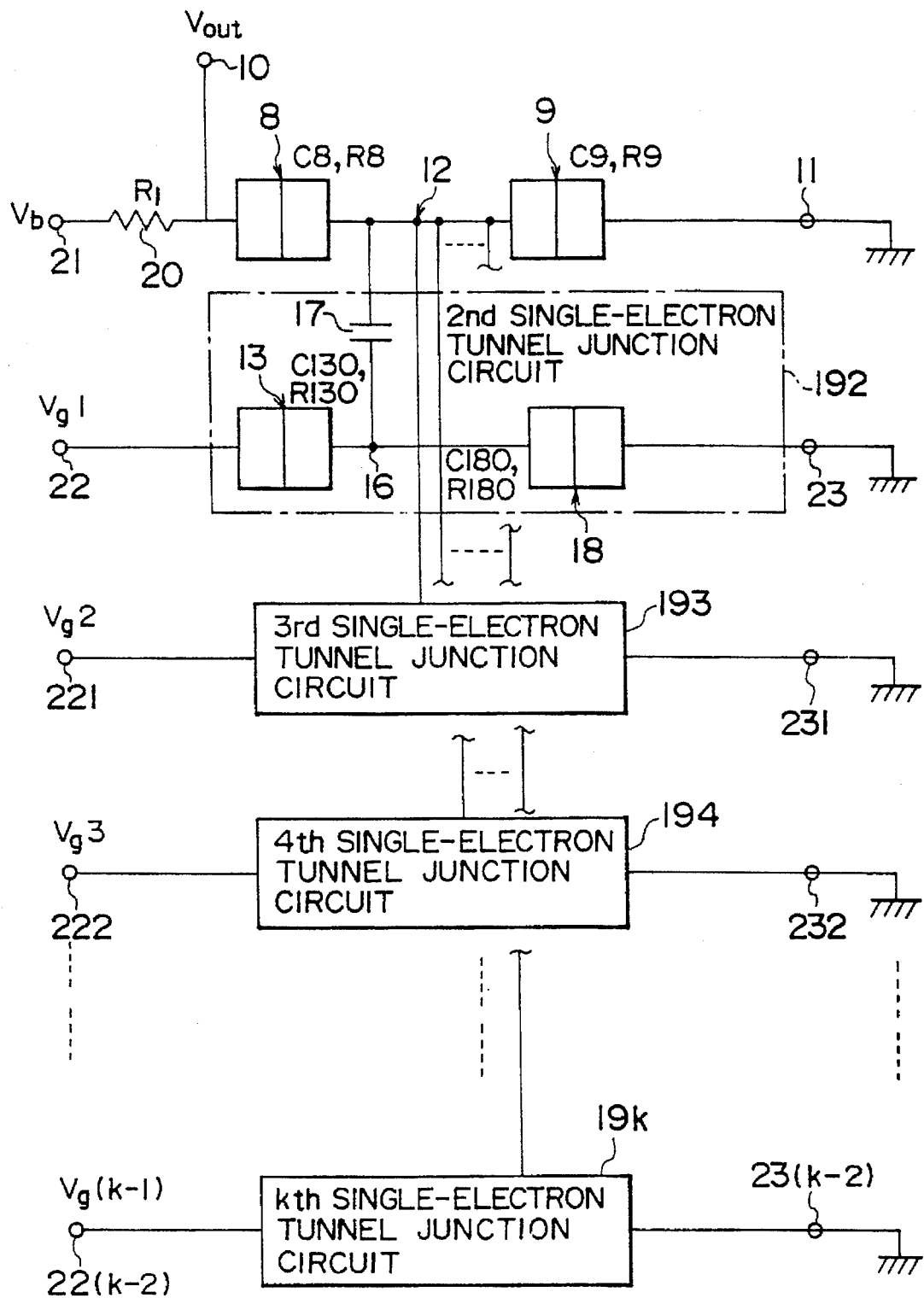
F I G. 10

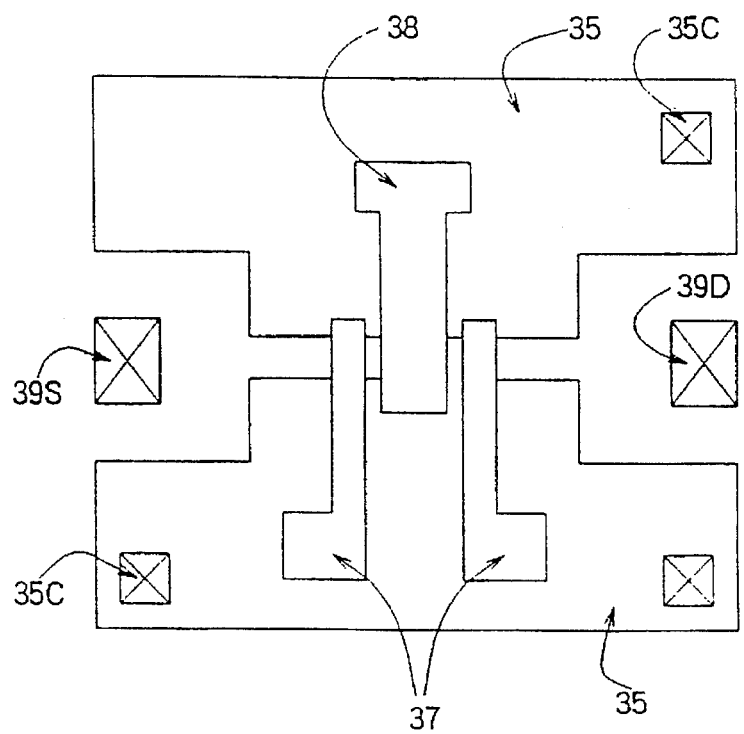
F I G. 11 (a)
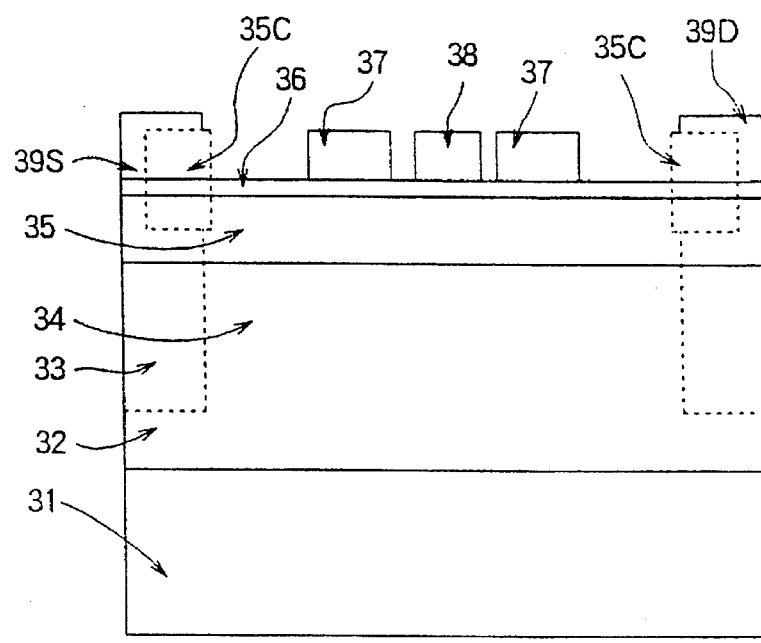
F I G. 11 (b)

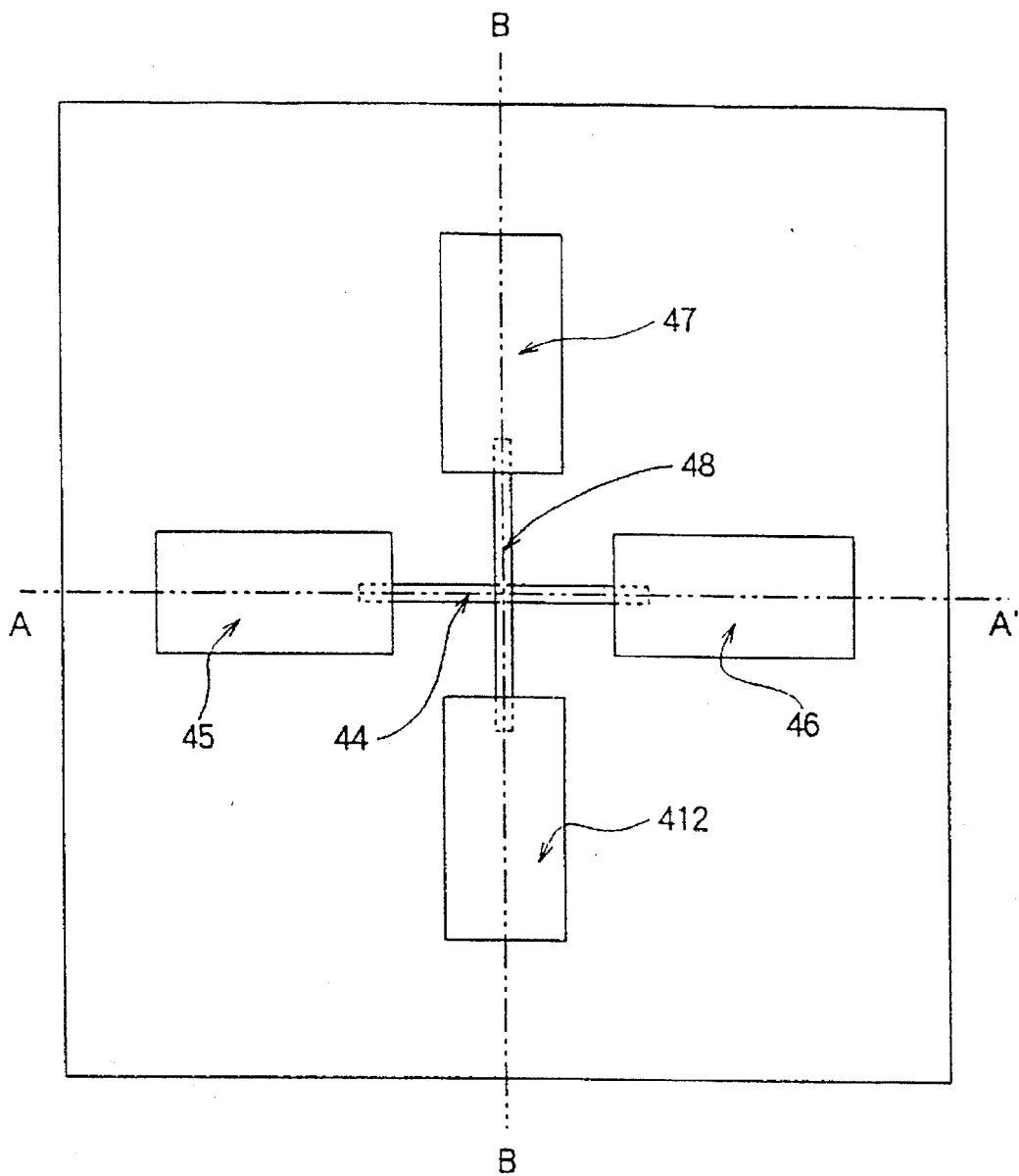
F I G. 13

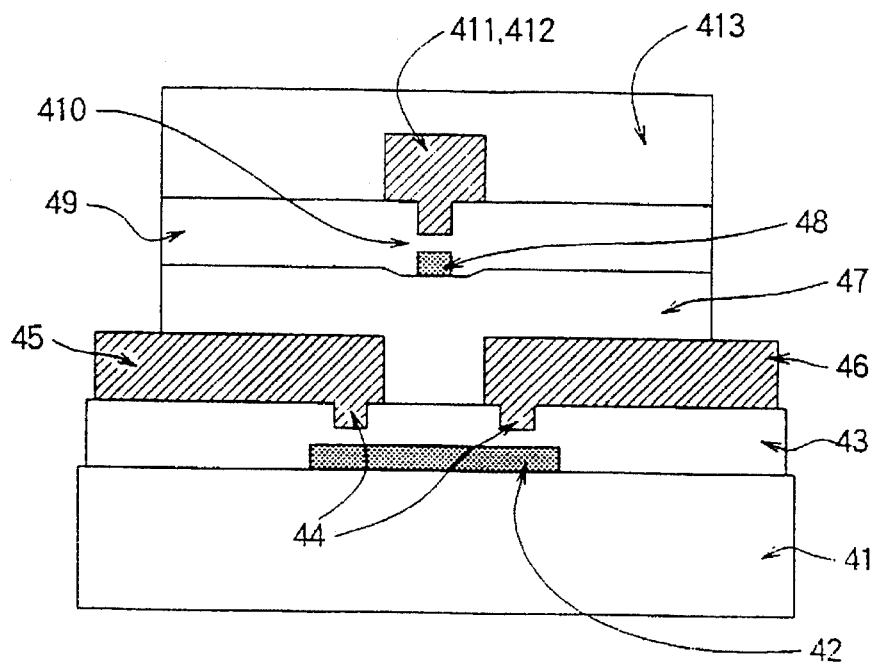
F I G. 14 (a)
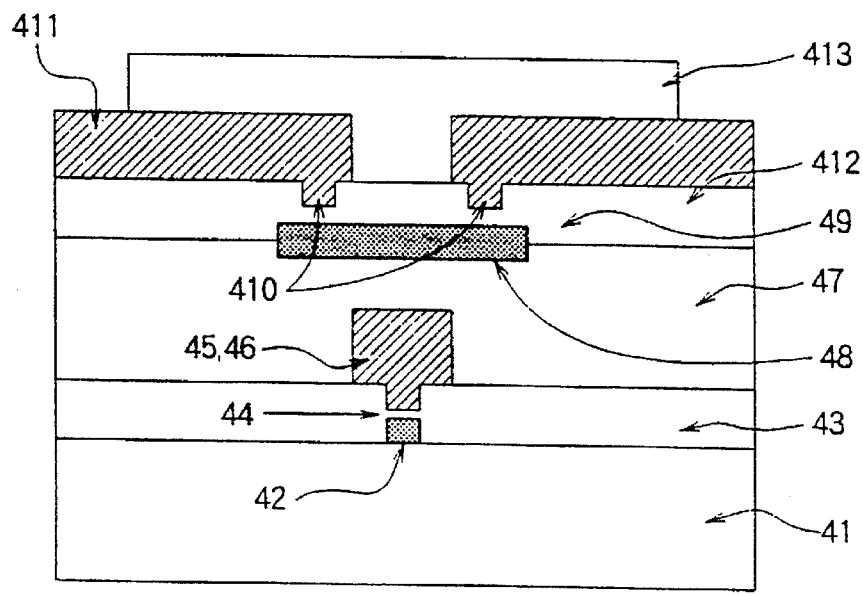
F I G. 14 (b)

SINGLE-ELECTRON TUNNELLING LOGIC DEVICE

DETAILED DESCRIPTION OF THE INVENTION

1. Field of Industrial Utilization

The present invention relates to a logic device, to which a single-electron tunnelling phenomenon is applied on the basis of Coulomb blockade.

2. Prior Art

Recently, various researches for the single-electron tunnelling phenomena observed in tunnel junctions having micro-capacitances have been performed extensively. By making the best use of the single-electron tunnelling, it is possible to realize a device extraordinarily high in speed and extraordinarily low in power consumption, in comparison with the conventional microscopic electron devices. Therefore, the single-electron tunnelling devices are now being studied anywhere for actualization.

The origin of the single-electron tunnelling can be summarized as follows: in the case of a tunnel junction having an extraordinary small capacitance, change in charging energy due to the tunnelling of a single electron through the junction is not negligible in comparison with the energy of thermal fluctuation $k_B T$ where T is absolute temperature and $k_B$ is Bolzmann's constant. Under these circumferences, an energy loss caused by a single-electron tunnelling must be inhibited. This is referred to as Coulomb blockade, which is the basic concept of the single electron tunnelling phenomena.

The basic unit of the single-electron tunnelling device using the Coulomb blockade characteristics is a three-terminal device composed of a double-tunnel junction structure obtained by connecting two tunnel junctions in series and a gate electrode connected to a middle electrode between these two tunnel junctions, the type of which is referred to as single-electron tunnelling transistor (SET), in particular. FIG. 15 shows the structure of this single-electron tunnelling transistor, in which the reference numerals 51 and 52 denote two tunnel junction portions connected in series. One end of the transistor is referred to as a source electrode portion 55, the other end thereof is referred to as a drain electrode portion 56. Further, a gate electrode 57 is connected to the middle electrode (island) portion 54 via a capacitor 53. When a predetermined bias voltage $V_{SD}$ (=$V_S$−$V_D$) is applied between the source and drain electrode portions 55 and 56 and further a voltage $V_g$ is applied to the gate electrode portion 57, it is possible to obtain linear characteristics between the bias voltage $V_{SD}$ and the channel current I flowing between the source and drain portions 55 and 56, which has a certain gap as shown in FIG. 16. The SET as described above is provided with roughly a linear current-voltage (I–$V_{SD}$) characteristics when the current I exceeds this gap. Therefore, when the voltage $V_g$ applied to the gate electrode 57 is changed as shown in FIG. 16, it is possible to control the voltage (Coulomb blockade voltage) at which the current I begins to flow. Further, FIG. 17 shows the current I obtained when the gate voltage $V_9$ is changed by keeping the bias voltage $V_{SD}$ equal to a constant value $V_b$. As shown in FIG. 17, the current I oscillates at a period $e/C_g$ according to the gate voltage $V_g$. This phenomenon is referred to as Coulomb oscillation. By best use of this Coulomb oscillation, it is possible to use the SET as shown in FIG. 15 as a switching device. In other words, the current value within the range $I \geq I_H$ is determined as a high level output $H_{out}$ and the current value within the range $I \leq I_L$ is determined as a low level output $L_{out}$, and the corresponding ranges of the gate bias $V_g$ are determined as the high level input $H_{in}$ and low level input $L_{in}$, respectively. As understood with reference to FIG. 17, it is desirable to determine the difference between $I_H$ and $I_L$ as large as possible, in order to distinguish the high level $H_{out}$ from the low level $L_{out}$ or vice versa. In this case, however, the input margin is reduced inversely to that extent. As a result, there exists a possibility that the high level output $H_{out}$ is changed to the low level output $L_{out}$ or vice versa by only a slight change of the input level, because the change between the $I_{min}$ and $I_{max}$ occurs steeply. As a result, there exists a problem in that this causes an erroneous operation of the SET.

With these problems in mind, therefore, the object of the present invention is to provide a single-electron tunnelling logic device, by which a stable output can be obtained when an input level fluctuates, by utilizing the best use of the double-tunnel junction characteristics.

In particular, the object of the present invention is to provide a single-electron tunnelling logic device including double-tunnel junctions, which can obtain Coulomb staircase as the current-voltage characteristics, by adjusting the time constants on the basis of the junction parameters of the tunnel junction portions and further by quantizing the charge accumulated at the island portion to roughly integer-time values of the prime charge e according to the input voltage.

Further, the object of the present invention is to provide a single-electron tunnelling logic device having double-tunnel junction structure, in which the time constant of the tunnel junction portions of the active circuit itself is adjusted to obtain the Coulomb staircase.

Further, the object of the present invention is to provide a single-electron tunnelling logic device, in which the time constant of the tunnel junction portions of the circuit is adjusted by providing a circuit having another tunnel junction portion as charge accumulating means at the gate input portion of the active circuit.

Further, the object of the present invention is to provide a single-element tunnelling logic device, in which the charge accumulation control circuit is formed by a double-tunnel junction circuit.

Means for Solving the Problems

A single-electron tunnelling logic device according to the present invention comprises: a double-tunnel junction portion formed by connecting first and second single-electron tunnel junctions in series, a bias voltage being applied to both ends thereof; and a signal input portion connected to a common junction portion between said first and second single-electron tunnel junction portions via a capacitance element, wherein charge accumulated at the common junction portion is quantized approximately in integer-time unit of a prime charge according to the bias voltage.

Here, in said double-tunnel junction portion, a tunnel resistance $R_T^{(i)}$ and a junction capacitance $C_i$ of the i-th (i=1, 2) single-electron tunnel junction are so determined that any one of the following conditions can be satisfied:

$$R_T^{(1)} > R_T^{(2)}, \ C_1 \geq C_2 \quad \text{(i)}$$

$$R_T^{(2)} > R_T^{(1)}, \ C_2 \geq C_1 \quad \text{(ii)}$$

Further, a single-electron tunnelling logic device according to the present invention comprises: a double-tunnel junction portion formed by connecting first and second single-electron tunnel junctions in series, a bias voltage being applied to both ends thereof; and a signal input portion connected to a common junction portion between said first and second single-electron tunnel junction portions via a capacitance element, wherein charge accumulated at another common junction portion between said signal input portion and the capacitance device is quantized approximately in integer-time unit of a prime charge according to an input voltage applied to said signal input portion.

Here, said signal input portion is a circuit formed by connecting first and second impedance elements in series, and further the common junction portion between the first and second impedance elements is connected to the capacitance element.

Further, at least one of the first and second impedance elements can be formed by a single-electron tunnel junction.

Further, the first and second impedance elements can be both formed by a single-electron tunnel junction, respectively, and these two single-electron tunnel junctions allowed to be different from each other in at least one of tunnel resistance and junction capacitance thereof.

Further, a plurality of the capacitance elements and a plurality of said signal input portions can be connected to the common junction portion between said first and second single-electron tunnel junctions.

Further, it is preferable that a tunnel resistance $R_T^{(1)}$ and a junction capacitance $C_1$ of the first impedance element and a tunnel resistance $R_T^{(2)}$ and a junction capacitance $C_2$ of the second impedance element are so determined that any one of the following conditions can be satisfied:

$$R_T^{(1)}C_1 > R_T^{(2)}C_2, \quad \text{(i)}$$

$$R_T^{(1)}C_1 < R_T^{(2)}C_2, \quad \text{(ii)}$$

Further, it is preferable that any one of the following conditions can be satisfied:

$$R_T^{(1)} > R_T^{(2)}, \; C^1 \geq C_2, \quad \text{(i)}$$

$$R_T^{(1)} < R_T^{(2)}, \; C^1 \leq C_2, \quad \text{(ii)}$$

Functions

According to the present invention, since the charge accumulated at the island is controlled in such a way that the output current characteristics with respect to the input voltage applied to the gate circuit are of Coulomb staircase, square waveform characteristics can be obtained as the output current characteristics (Coulomb oscillation characteristics) with respect to the input signal voltage, so that a constant output current value can be obtained with respect to a constant voltage width of the input signal. As a result, the margin of the voltage with respect to the respective input logic levels can be widened. Consequently, it is possible to obtain a stable output with respect to the input voltage fluctuations, by effectively unitizing the double-tunnel junction characteristics.

Further, in the Coulomb oscillation characteristics, even if the output current values corresponding to the respective high-level output and the low-level output and the difference between the two are changed so as to be increased as much as possible, since the input voltage width can be maintained at a constant width, it is possible to widen the difference between the high-level output and the low-level output, without reducing the margin of the voltage value with respect to the input logical levels.

BRIEF DESCRIPTION OF THE DRAWINGS

FIG. 7 is a graphical representation showing the conditions that parameters related to the junction capacitances must be satisfied, which are required when a one-input logic gate is constructed by the SET shown in FIG. 5;

FIG. 9 is a graphical representation showing the conditions that parameters related to the junction capacitances must be satisfied, which are required when a two-input logic gate is constructed by the single-electron logic device shown in FIG. 8;

FIG. 10 is a circuit diagram showing the single-electron logic device structure related to the fifth embodiment of the present invention;

FIG. 11(a) is a plane view showing the device structure of the A-SET related to the present invention shown in FIG. 1, and FIG. 11(b) is a cross-sectional view showing the same;

FIG. 13 is a plane view showing the device structure of the single-electron logic device related to the present invention shown in FIG. 5;

FIG. 14(a) is a cross-sectional view showing the device structure, taken along the line A–A' in FIG. 13, and FIG. 14(b) is a cross-sectional view showing the same device structure, taken along the line B–B' in FIG. 13;

Embodiments

Figure 1:
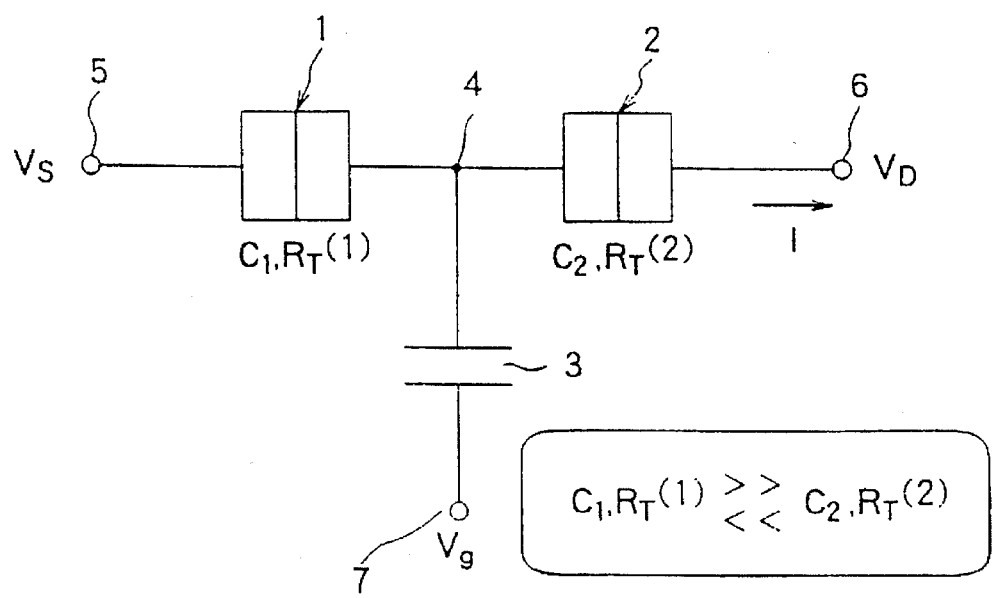
FIG. 1 is a circuit diagram showing the structure of the double-tunnel junction single-electron transistor (A-SET) related to the first embodiment of the present invention.

The embodiments of the present invention will be described hereinbelow with reference to the attached drawings. FIG. 1 is a circuit diagram showing a first embodiment of the single-electron transistor according to the present invention. In the drawing, two capacitors 1 and 2 having capacitances $C_1$ and $C_2$, respectively form a double-tunnel junction circuit as an active circuit, through which charge tunnelling can be enabled. The tunnel resistances thereof are $R_1$ and $R_2$, respectively. Here, however, these junction parameter values are assumed to be determined in the ranges in which a single-electron tunnelling can be expected through the junctions and thereby the Coulomb blockade can occur. For the purpose, the following conditions are required to be satisfied:

$$\min(e^2/2C_1, e^2/2C_2) \geq k_B T, \quad (1)$$

$$R_i \geq R_q, (i=1, 2), \quad (2)$$

where e is the prime charge, $k_B$ is the Boltzmann's constant, T is absolute temperature, and $R_q = h/(2e^2) = 12.9$ kΩ is the quantum resistance.

As shown in FIG. 1, the two tunnel junction portions 1 and 2 are connected in series to form a double-tunnel junction structure. The one end thereof is a source electrode terminal 5 and the other end thereof is a drain electrode terminal 6, between which a voltage $V_{SD}$ ($=V_S-V_D$) is applied. A region denoted by 4 between the two tunnel junction portions 1 and 2 corresponds to an island portion of the double-tunnel junction, which is connected to a gate electrode terminal 7 via an ordinary capacitor 3 of a capacitance $C_g$ (through which the tunnelling will not occur). This gate electrode terminal 7 is a signal input terminal. The object of the present invention cannot be attained by the current-voltage (I–$V_{SD}$) characteristics the same as those of the conventional single-electron transistor;. that is, the roughly linear (I–$V_{SD}$) characteristics having a gap. In the double-tunnel junction structure as described above, however, there exist combinations of junction parameters which can represent the step-like (I–$V_{SD}$) characteristics (referred to as Coulomb staircase, hereinafter). By utilizing the characteristics, it is possible to expect the object and effect of the present invention.

In the double-tunnel junction structure, the Coulomb staircase results from the incremental charging on the island portion 4 by the applied bias voltage $V_{SD}$. Here, it should be noted that the charge will not be accumulated on the island portion 4 by the application of the gate bias voltage $V_g$. When the Coulomb staircase is developed, the charge accumulated on the island portion 4 is quantized to a roughly integral value times e (a prime charge). Therefore, it is necessary to determine the junction parameters so that the charge can be accumulated on the island portion 4. For this purpose, a certain difference is required in the time constants $R_1 \cdot C_1$ and $R_2 \cdot C_2$ of the tunnel junction portions 1 and 2, respectively. That is, the junction parameters are determined in such a way that at least one of the two following conditions can be satisfied:

$$R_1 C_1 > R_2 C_2 \text{ or } R_1 C_1 < R_2 C_2. \quad (3)$$

Of course, it is preferable that the difference in RC time constants of junctions is large. Preferably, the difference is determined so that one differs from the other by at least one digit or more.

Further, in order to enhance the effect of incremental charging on the island portion 4 by the applied bias voltage, the junction parameter values should be chosen so that any of the two following conditions can be satisfied:

$$R_1 > R_2, C_1 \geq C_2 \quad (4)$$

$$R_2 > R_1, C_2 \geq C_1 \quad (5)$$

In these conditional expressions, it is desirable that the difference between the two is large.

Figure 2:
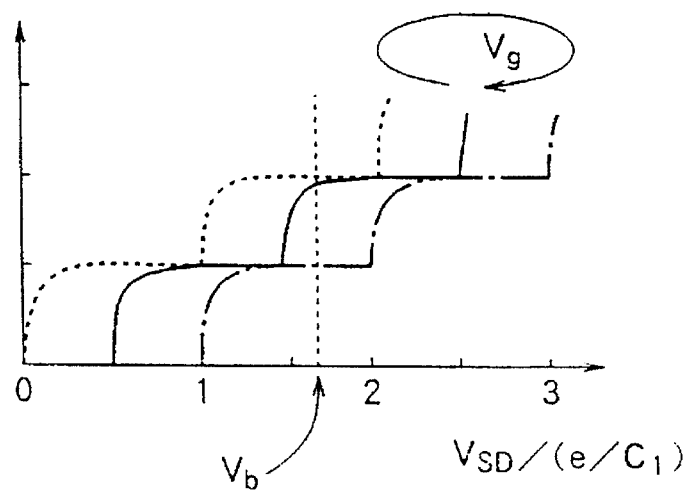
FIG. 2 is a graphical representation showing the I–$V_{SD}$ characteristics with the gate bias as parameters, in which the tunnel resistances $R_1$ and $R_2$ and the junction capacitances $C_1$ and $C_2$ of the two tunnel junction portions of the A-SET are decided as $R_1 \gg R_2$ and $C1 \gg C_2$ respectively.
Figure 3:
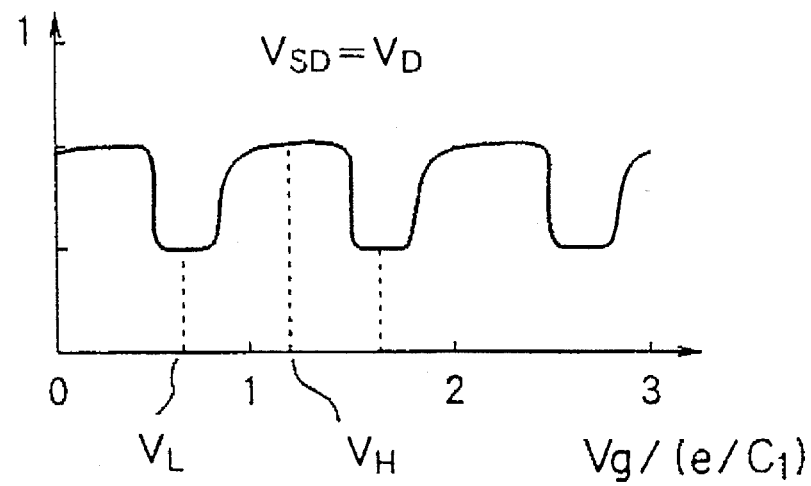
FIG. 3 is a graphical representation showing the I–$V_g$ (Coulomb oscillation) characteristics of the A-SET when $V_{SD}$ is fixed to $V_b$ shown in FIG. 2.

For simplification, on the assumption that the junction parameters are selected so as to satisfy the condition as defined by the equation (4), the transport properties and the effects of the asymmetrical double-tunnel junction single-electron transistor (A-SET) as shown in FIG. 1 will be explained hereinbelow. FIG. 2 shows the typical I–$V_{SD}$ characteristics of the A-SET shown in FIG. 1, and FIG. 3 shows the I–$V_g$ characteristics obtained when the gate bias voltage $V_g$ of the same A-SET is changed; that is, so-called Coulomb oscillation. As shown in FIG. 2, the I–$V_{SD}$ characteristics represent the Coulomb staircase according to the bias voltage $V_{SD}$, and this indicates that the double-tunnel junction circuit constituting an active circuit involves a charge accumulation control circuit. In this case, as understood by FIG. 3, the output current I changes in accordance with roughly a rectangular shape according to the gate voltage $V_g$, and further the rectangular shape is repeated periodically. Accordingly, when the input voltage $V_g$ is set to a voltage corresponding to the middle point of the roughly flat portion of the rectangular range, it is possible to obtain a stable output to the fluctuations of the input voltage $V_g$. Further, by the unitization of the periodic characteristics thereof, it is also possible to set the two input levels at two different values sufficiently separated from each other.

For instance, the larger current value is determined as the high level output ($H_{out}$), and the middle point of the voltage range corresponding to $H_{out}$ is determined as $V_H$ as shown in FIG. 3. On the other hand, the smaller current value is determined as the low level output ($L_{out}$), and the middle point of the voltage range corresponding to $L_{out}$ is determined as $V_L$ also as shown in FIG. 3. In this case, if both the middle voltages are selected as $V_H < V_L$ and further if the vicinity of $V_H$ is determined as the low level input $L_{in}$ and the vicinity of $V_L$ is determined as the high level input $H_{in}$, the A-SET operates under these conditions as an inverter. Further, by use of the periodic characteristics of the Coulomb oscillation (the oscillation period of this case is $e/C_1$), if both the middle voltages are selected as $V_H > V_L$, and further if the vicinity of $V_H$ is set to the high level input $H_{in}$ and the vicinity of $V_L$ is set to the low level input $L_{in}$, the A-SET can operate under these conditions as an ordinary switching device. Further, as already explained, it is also possible to set $V_H$ and $V_L$ sufficiently away from each other owing to the presence of the periodic characteristics.

Here, the single-electron transistor whose basic structure is such that the two tunnel junction structures are connected in series has been described. In more generic way, the same as above can be applied to the single-electron tunnelling logic device of a multi-tunnel junction structure composed of a series of single-electron tunnel junctions (in which a plurality of tunnel junction structures are connected in series).

Figure 4:
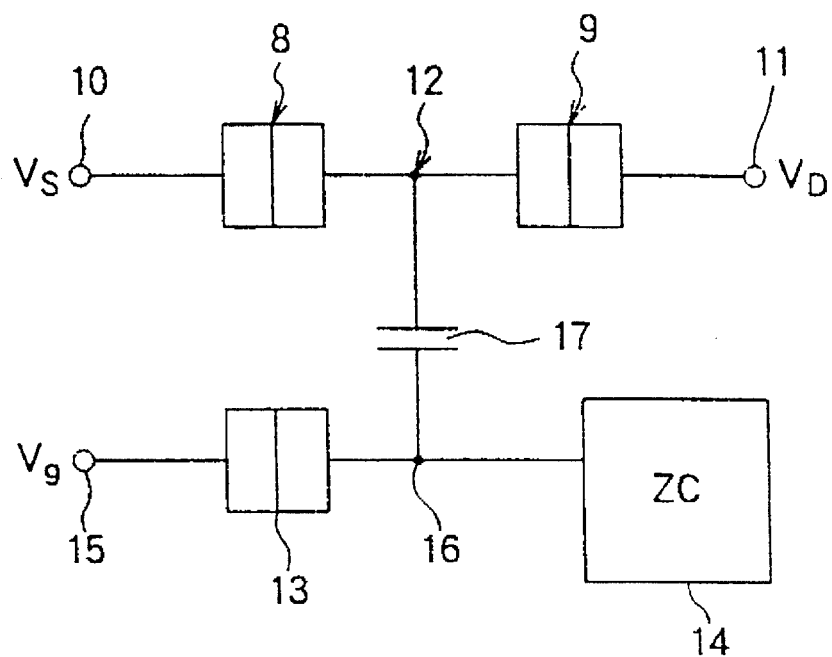
FIG. 4 is a circuit diagram showing the SET structure related to the second embodiment of the present invention.

FIG. 4 shows a single-electron transistor related to a second embodiment according to the present invention. In FIG. 4, the double-tunnel junction circuit constituting an active circuit is of symmetrical double-tunnel junction structure, in which the reference numerals 8 and 9 denote tunnel junction portions; 10 denotes a source electrode; 11 denotes a drain electrode; and 12 denotes an island portion. Here, the junction parameters of the tunnel junction portions 8 and 9 are determined symmetrically, so that no Coulomb staircase is obtained, in the same way as with the case of the conventional one.

To the island portion 12, a charge accumulation control circuit is connected via an ordinary capacitor 17 (through which no tunnelling occurs). The charge accumulation control circuit is composed of a tunnel junction portion 13 and an impedance circuit (ZC) 14 both connected in series. The capacitor 17 is connected to a middle electrode (island) portion 16 of this series-connected control circuit. One end (on the tunnel junction portion (13) side) of the control circuit is a gate electrode 15 to which a signal to be quantized is inputted. Therefore, a quantized charge is accumulated on the island portion 16 of the charge accumulation control circuit. In other words, charges roughly equal to an integral value times e (prime charge) are stored on the island 16 with a voltage range according to the voltage for driving the double-tunnel junction, and the potential at this island portion 12 can be controlled by this charge. This indicates that in the case of the construction as shown in FIG. 4, a roughly constant output current I can be obtained over a voltage range according to an input voltage $V_g$, so that it is possible to design a device having a margin for the input signal. As this impedance circuit ZC, any circuits can be adopted, as far as the circuit has such a function as to charge electrons in unit of single electron at the middle electrode 16. For instance, a circuit including a single-electron tunnel junction structure or a single-electron transistor can be adopted and it is permissible to use without the impedance circuit ZC itself. Further, a circuit provided with a multiple single-electron tunnel junction train having two or more tunnel junction portions and with a terminal group led out of the respective island portions between two adjacent tunnel junctions via a capacitance element, respectively can be adopted. Further, a simple ordinary capacitance train can be considered. In any cases, when the capacitance of the circuit 14 is determined to be a value about 10 times larger than that of the junction capacitance C13 of the tunnel junction portion 13, it is possible to obtain a sufficient margin to the input signal. For instance, if $C_{13}$ is 10 aF, the circuit 14 having a capacitance of about 100 aF is used.

Figure 5:
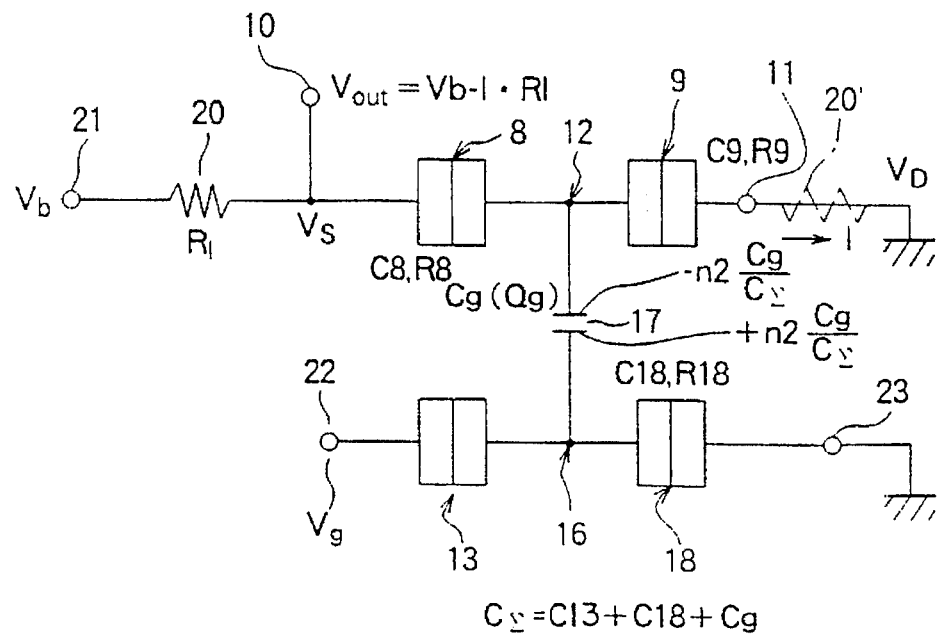
FIG. 5 is a circuit diagram showing the SET structure related to the third embodiment of the present invention.

FIG. 5 shows a third embodiment of the present invention, in which the impedance circuit 14 shown in FIG. 4 is formed by the tunnel junction structure. In FIG. 5, a double-tunnel junction circuit composed of two tunnel junction portions 13 and 18 constructs the charge accumulation control circuit. An island portion 16 of this charge accumulation control circuit is connected to another island portion 12 between the two tunnel junction portions 8 and 9 via a capacitor 17 having a capacitance $C_g$. The capacitances of the tunnel junction portions 8, 9, 13 and 18 are $C_8$, $C_9$, $C_{13}$ and $C_{18}$, respectively, and the tunnel resistances thereof are $R_8$, $R_9$, $R_{13}$ and $R_{18}$, respectively.

A drain electrode 11 of the active circuit is grounded; a source electrode 10 thereof is connected to an output terminal 10 for outputting an output voltage $V_{out}$; and a load element 20 of a resistance $R_1$ is connected to the output terminal 10. The other end of this load element 20 is connected to a bias voltage application terminal 21 for supplying a bias voltage $V_b$ required to drive the transistor.

An electrode of the tunnel junction portion (13) side of the charge accumulation control circuit is a gate electrode 22 for inputting a voltage signal $V_g$ to be quantized to the transistor. An electrode 23 of the tunnel junction portion (18) side of the same charge accumulation control circuit is grounded.

The transistor as described above is assumed to be operative under such environments that the Coulomb blockade occurs. For the purpose, the respective composing elements must satisfy the following conditions, for instance:

$$\min\left(\frac{e^2}{2C_\Sigma^{(1)}}, \frac{e^2}{2C_\Sigma^{(2)}}\right) \geq K_B T \quad (6)$$

$$R_j \geq R_q \ (j=8, 9, 13, 18) \quad (7)$$

where e is the prime charge, $k_B$ is the Boltzmann's constant, T is the absolute temperature, and $R_q = h/(2e^2) = 12.9$ k$\Omega$ is the quantum resistance. Further, $C_\Sigma^{(i)}$ (i=1, 2) are the capacitances of the island portions 12 and 16 of the two double-tunnel junction circuits, respectively, which can be expressed as $$C_\Sigma^{(1)} = C_g + C_8 + C_9, \ C_\Sigma^{(2)} = C_g + C_{13} + C_{18}.$$

In the double-tunnel junction circuit for constituting the active circuit, the resistance $R_1$ of the load element 20 is determined to be at least higher than that of the quantum resistance $R_q$ so that the circuit can be operative under the high impedance environment as follows:

$$R_1 \geq R_q \quad (8)$$

Further, the double-tunnel junction circuit is constructed by such junction parameters that the stepwise-changing I–$V_{SD}$ characteristics (referred to as Coulomb staircase) cannot be developed. For this, the junction parameters are determined as $$R_8 \geq R_9, C_8 \geq C_9 \quad (9)$$

or $$R_8 \leq R_9, C_8 \geq C_9 \quad (10)$$

On the other hand, in the double-tunnel junction circuit of the charge accumulation control circuit, the resistance components of the electrodes connected thereto are determined to be sufficiently smaller than that of the quantum resistance $R_q$ so that the circuit can be operative under the low impedance environment.

Further, the double-tunnel junction circuit is constructed by asymmetrical junction parameters so that the stepwise-change I–$V_{SD}$ characteristics (referred to as Coulomb staircase) can be developed. In this case, the conditions that the Coulomb staircase is obtained in the double-tunnel junction circuit are as follows:

$$R_{13} > R_{18}, C_{13} \geq C_{18} \quad (11)$$

or $$R_{13} < R_{18}, C_{13} \leq C_{18} \quad (12)$$

Where the above-mentioned conditions are satisfied, when the voltage $V_g$ is applied to the gate electrode 22 of the double-tunnel junction circuit, tunnel current will not flow in the range of $|V_g| < V_c$ because tunnelling is inhibited. The voltage $V_c$ at this critical point is referred to as Coulomb blockade voltage. On the other hand, in the range of $|V_g| \geq V_c$, the tunnel current increases stepwise with increasing applied voltage, so that the Coulomb staircase develops. This phenomenon results from the fact that the charge stored on the island portion 16 of the double-tunnel junction circuit is quantized in unit of the prime charge e under the Coulomb blockade conditions. In other words, the charge stored on the island portion 16 changes by±e with increasing applied voltage $V_g$. Here, the sings±of the prime charge e are determined in dependence upon the junction parameters of the double-tunnel structure.

For simplification, only the case where the conditions as expressed by the equation (12) are satisfied will be discussed hereinbelow. In this case, the Coulomb blockade voltage becomes $V_c = e/(2C_{18})$. In general, although the voltage step $\Delta V_2$ of the Coulomb staircase depends upon the junction parameters of the tunnel junction portions 13 and 18 or the temperature, as far as the temperature satisfies the equation (6) sufficiently and further the tunnel resistances of the double-tunnel junctions are different from each other extremely as $R_{18} \gg R_{13}$, the voltage step $\Delta V_2$ of the Coulomb staircase can be given approximately as $$\Delta V_2 = e/C_{18}. \tag{13}$$

Figure 6:
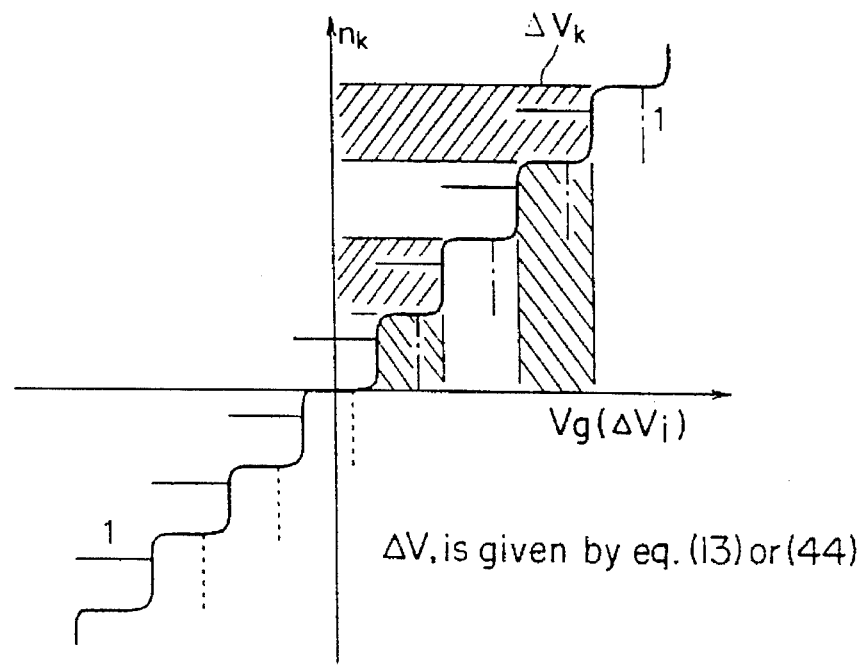
FIG. 6 is a graphical representation showing the relationship between $V_g$ and the number of charges stored on the island portions of two tunnel junction portions of the charge accumulation control circuit.

In FIG. 6, the charge $n_2$ accumulated on the island portion 16 of the double-tunnel junction circuit of the charge accumulation control circuit is expressed in unit of the prime charge e to the signal voltage $V_g$. Therefore, in this case, the following charge can be induced in the capacitance 17:

$$Q_g = (C_g/C_\Sigma^{(2)}) e \cdot n_2. \tag{14}$$

Now, since the active circuit is operative under the high impedance environment, the Coulomb blockade voltage $V_{c1}$ can be expressed as $$V_{c1} = e/(2C_1), \tag{15}$$

where $C_1$ denotes the series-connected capacitance of the capacitors $C_8$ and $C_9$ of the two tunnel junction portions 8 and 9 expressed as follows:

$$C_1 = C_8 \cdot C_9/(C_8 + C_9). \tag{16}$$

Therefore, when the bias voltage $V_b$ is applied to the voltage application terminal 21 so that the output voltage at the electrode 10 becomes $$V_{out} \geq V_{c1}, \tag{17}$$

the output voltage $V_{out}$ changes in period the prime charge e according to $Q_g$ given by the equation (14). In the ideal case, the output voltage $V_{out}$ becomes as $$V_{out} = \frac{R_t \cdot (V_b - V_1^{(c)} - 2\delta V \cdot x)}{R_8 + R_9 + R_1} \tag{18}$$

where $$\delta V = e/C_\Sigma^{(1)}, \tag{19}$$

$$x = Q_g/e - [Q_g/e + 0.5]. \tag{20}$$

Here, [a] indicates the greatest integer less than or equal to a.

By the way, since x lies within a range of $0.5 \leq x < 0.5$ according to $Q_g$, $V_{out}$ is minimum when $x = -1/2$, increases with increasing x, and reaches its maximum value when $x = 1/2 - 0^+$. Therefore, by appropriately selecting $x_L$ and $x_H$ in the ranges $(-0.5 < x_L < 0)$ and $(0 < x_H < 0.5)$, respectively, it is possible to allow the output belonging to the range of $(-0.5 \leq x \leq x_L)$ to correspond to the "low-level" signal and the output belonging to the range of $(x_H \leq x \leq 0.5)$ to correspond to the "high-level" signal, respectively. However, it is necessary to select the junction parameters in such a way that the output ranges corresponding to $(-0.5 \leq x \leq x_L)$ and $(x_H \leq x \leq 0.5)$ can stay within the voltage step $\Delta V_2$ of the Coulomb staircase as given by the equation (13).

Further, in the following discussion, the generic characteristics can be maintained if $V_b$ and $R_1$ are rewritten as $$V_b = V_{c1} + \alpha \cdot \delta V, \quad R_1 = \gamma \cdot (R_{13} + R_{18}). \tag{21}$$

On the basis of the conditions of equations (7) and (8), $\gamma$ is required to satisfy $$\gamma \geq 1/2. \tag{22}$$

Further, it is understood that on the basis of the condition of the equation (17), it is sufficient if $\alpha = \gamma$. Under these conditions, the equation (18) can be rewritten as $$V_{out} = V_{c1} + (\gamma/(\gamma+1)) \cdot (1 + 2x) \delta V. \tag{23}$$

By substituting $x = -1/2$ and $x = x_L$ into the equation (23), the lower limit value $V_L^{(inf)}$ and the upper limit value $V_L^{(sup)}$ of the low level signal $V_L$ can be determined as $$V_L^{(inf)} = V_{c1}$$

$$V_L^{(sup)} = V_{c1} + (\gamma/(\gamma+1)) \cdot (1 + 2x_L) \delta V. \tag{24}$$

Further, by substituting $x = x_H$ and $x = 1/2$ into the equation (23), the lower limit value $V_H^{(inf)}$ and the upper limit value $V_H^{(sup)}$ of the high level signal $V_H$ can be determined as $$V_H^{(inf)} = V_{c1} + (\gamma/(\gamma+1)) \cdot (1 + 2x_H) \delta V.$$

$$V_H^{(sup)} = V_{c1} + (2\gamma/(\gamma+1)) \cdot \delta V. \tag{25}$$

The input to the charge accumulation control circuit will be described hereinbelow.

TABLE 1

| $Q_g/e$ | $C_g C_\Sigma^{(2)} \cdot n_2$ | $C_g/C_\Sigma^{(2)} \cdot n_2'$ |
|---------|-------------------------------|--------------------------------|
| x       | $X(C_g/C_\Sigma^{(2)} \cdot n_2)$ | $X(C_g/C_\Sigma^{(2)} \cdot n_2')$ |

Here, in Table 1, the values x to $Q_g$ are listed. Further, the function $X(y)$ is defined as $X(y) = y - [y + 1/2]$, where [a] denotes the greatest integer less than or equal to a.

Table 1 above lists the values $Q_g$ given by the equation (14) and values x given by the equation (20) when the charge stored on the island portion 16 of the charge accumulation control circuit is $(n_2 \cdot e)$ or $(n_2' \cdot e)$, respectively. According to FIG. 6 in order to obtain the above charged states in the island portion 16, the following voltage $V_2$ is inputted to the gate electrode 22 of the charge accumulation control circuit:

$$\Delta V_2 \cdot (n_2 - (1/2)) < V_2 < \Delta V_2 \cdot (n_2 + (1/2)) \text{ or}$$

$$\Delta V_2 \cdot (n_2' - (1/2)) < V_2 < \Delta V_2 \cdot (n_2' + (1/2)),$$

where $n_2$ and $n_2'$ are integral values, respectively.

In accordance with these equations, the voltage characterized by $n_2$ is allowed to correspond to the "low-level ($V_L$)" and the voltage characterized by $n_2'$ is allowed to correspond to the "high-level ($V_H$)". By substituting the equation (13) into the above equations, the following equations can be obtained:

$$(e/C_{18})(n_2 - (1/2)) < V_L < (e/C_{18})(n_2 + (1/2)), \tag{26}$$

$$(e/C_{18})(n_2' - (1/2)) < V_H < (e/C_{18})(n_2' + (1/2)). \tag{27}$$

On the basis of the relationship between the equations (26) and (27) and the equations (24) and (25), respectively, the following equations can be obtained $$V_L^{(sup)} \leq (e/C_{18})(n + (1/2)), \tag{28}$$

$$V_L^{(sup)} - V_H^{(inf)} \leq e/C_{18}, \tag{29}$$

$$V_H^{(inf)} \geq (e/C_{18}(n' - (1/2)), \tag{30}$$

$$V_L^{(sup)} - V_H^{(inf)} \leq e/C_{18}, \tag{31}$$

where $n_2$ and $n_2'$ are rewritten as n and n', respectively.

In practice, a logical gate in which the following equations are satisfied is taken into account:

$$C_{13} = (5 - 3\beta) C_g,$$

$$C_{18} = 3(2 + \beta) C_g, \tag{32}$$

$(C_8/C_g)+(C_9+C_g)=2p,$ $(C_8/C_g)\cdot(C_9/C_g)=q, (p,q>0)$ (33)

$n'=n+3, n=5, 17, 29, \ldots$ (34)

Here, the situation that the equation (12) can be established is considered β must lie within a range as $(-1/6) \leq \beta < (5/3).$ Under these conditions, since $C_g/C_\Sigma^{(2)}=1/12$, Table 1 can be rewritten as

TABLE 2

| $Q_g/e$ | $n_2/12$ | $(n_2 + 3)/12$ |
|---|---|---|
| x | 10/24 | −8/24 |

Table 2 lists the values x to $Q_g$.

Here, $x_L$ and $x_H$ are selected as $X_L=-7/24, X_H=9/24$ (36)

Further, when the equations (28) to (31) are evaluated by substituting the equation (36) into the equations (24) and (25) and by use of the equations (15), (16), (32) and (33), the following conditional equations with respect to p and q are obtained as $$\frac{2n+5}{6(2+\beta)} \cdot \frac{1}{P} \cdot \frac{\gamma}{1+\gamma} \cdot \frac{7}{8} \cdot \frac{1}{P(P+1/2)} \leq \frac{1}{q} \leq$$ (37)

$$\frac{2n+1}{6(2+\beta)} \cdot \frac{1}{P} \cdot \frac{\gamma}{1+\gamma} \cdot \frac{5}{24} \cdot \frac{1}{P(P+1/2)}$$

$q \leq p^2$ (38)

$$\frac{5}{8} \cdot \frac{\gamma(4+\beta)}{1+\gamma} < P+1 < \frac{\gamma(4+B)}{1+\gamma}$$ (39)

Therefore, when β, γ, p, q and n (=5, 12, 29, ...) are selected so that the above-mentioned conditions and the equation (22) can be satisfied and further when the $V_L$ and $V_H$ given by the equation (26) and (27) are allowed to correspond to the high level (H) and the low level (L) of the input and output signals, the input and output levels of the transistor as shown in FIG. 5 can be given by the following table 3:

TABLE 3

| INPUT $V_g$ | L | H |
|---|---|---|
| OUTPUT $V_{out}$ | H | L |

Table 3 lists the input and output levels of the single-electron double-tunnel junction logic gate of the third embodiment of the present invention shown in FIG. 5. As a result, the single-electron double-tunnel junction device as constructed above can operate as an inverter.

Here, when β, γ and n are determined in practice as β=1.5; γ=10; and n=5, p and q which satisfy the equations (37) to (39) lie within a range as shown by oblique lines in FIG. 7. For instance, p=2.5 and q=5.5 lie within the oblique-line range. When β, γ, p, q and n are determined as described above, on the basis of the equations (32) and (33), the capacitances of the tunnel junctions can be determined as $C_8=1.6C_g; C_9=3.4C_g,$ (or $C_{13}=3.4C_g; C_{18}=1.6C_g$), $C_{13}=C_g/2; C_{18}=21C_g/2.$ Here, $C_g$ is determine so as to satisfy the equation (6). On the other hand, the tunnel resistances of the tunnel junctions are selected so that the equations (9) (or (10)), (12) and (7) can be satisfied.

When the junction parameters are decided as described above, the transistor of the third embodiment can operate as an inverter.

According to the present embodiment, the junction parameters of the charge accumulation control circuit are so determined as to develop the Coulomb staircase, and further the current I flowing through the active circuit (i.e., the output voltage $V_{out}$) is kept constant with respect to the input voltage $V_g$ within a predetermined range, on the basis of the staircase characteristics between the input voltage $V_g$ and the charge $n_2$ stored on the island portion. Accordingly, it is possible to obtain such an effect that the input margin can be improved.

Figure 8:
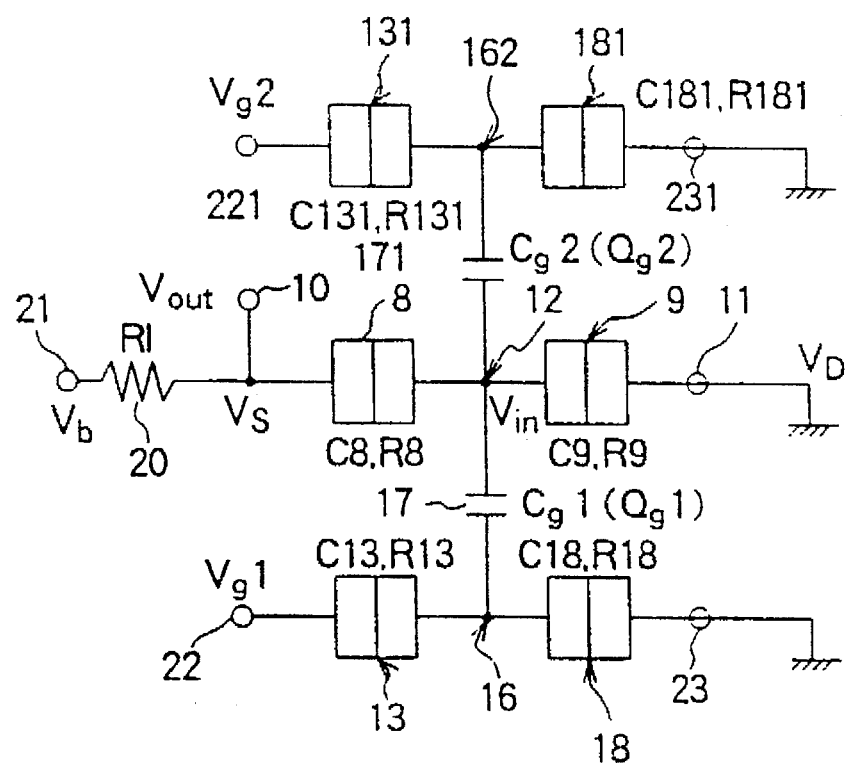
FIG. 8 is a circuit diagram showing the single-electron logic device structure related to the fourth embodiment of the present invention.

FIG. 8 shows a fourth embodiment of the single-electron tunnel junction logic device according to the present invention, which functions as a two-input device. The device is composed of a double-tunnel junction circuit (8 and 9) which functions as an active circuit without having the Coulomb staircase characteristics in the I–$V_{SD}$ characteristic curve and two double-tunnel junction circuits which function as the charge accumulation control circuit having Coulomb staircase characteristics.

One end of the tunnel junction portion 13 is a gate electrode (i.e., an input terminal) 22 to which a signal voltage $V_{g1}$ is applied, and one end of the tunnel junction portion 18 is an electrode 23 that is grounded. Further, one end of a capacitor 17 with the capacitance $C_{g1}$ is connected to the island portion 16 between the two tunnel junction portions 13 and 18 and the other end thereof is connected to an island portion 12 of the active circuit.

The second charge accumulation circuit is composed of the third double-tunnel junction circuit (a series-circuit of two tunnel junction portions 131 and 181). In FIG. 8, $C_{131}$ is the capacitance of tunnel junction portion 131, $R_{131}$ is the resistance of the tunnel junction portion 131, $C_{181}$ is the capacitance of the tunnel junction portion 181, and $R_{181}$ is the resistance of the tunnel junction portion 181. One electrode of the tunnel junction portion 131 is a signal voltage input terminal $V_{g2}$, and one electrode of the tunnel junction portion 181 is grounded. One end of a capacitor 171 having a capacitance $C_{g2}$ is connected to the island portion 162 between the two tunnel junction portions 131 and 181, and the other end thereof is connected to the island portion 12 of the active circuit.

The transistor constructed as described above is assumed to be operative under the environment that the Coulomb blockade develops. For this purpose, the respective composing devices st satisfy the following conditions, for instance:

$$\min\left(\frac{e^2}{2C_\Sigma^{(1)}}, \frac{e^2}{2C_\Sigma^{(2)}}, \frac{e^2}{2C_\Sigma^{(3)}}\right) \geq k_B T$$ (40)

$R_j > R_q, (j=8,9,13,18,131,181)$ (41)

Here, $C_\Sigma^{(i)}$ (i=1, 2, 3) denotes each capacitance of the middle electrodes of the three double-tunnel junction structures, respectively, which can be expressed as $C_\Sigma^{(1)}=C_{g1}+C_{g2}+C_8+C_9,$ $C_\Sigma^{(2)}=C_{g1}+C_{13}+C_{18},$ $C_\Sigma^{(3)} = C_{g2} + C_{g131} + C_{g181}$.

Further, in the same way as with the case of the third embodiment, the resistance $R_1$ of the load element 20 is determined so that the active circuit can be operative under the high impedance environment, that is, the condition as expressed by the equation (8) can be satisfied. On the other hand, in the double-tunnel junction circuits for constructing the charge accumulation control circuits, the resistance components of the electrodes connected thereto are determined to be sufficiently smaller than the quantum resistance $R_q$, so that the circuit can be operative under the low impedance environment.

In addition to the above-mentioned conditions, the active circuit is constructed by the junction parameters for satisfying the equations (9) and (10) so that the Coulomb staircase is not developed in the current-voltage characteristics. On the other hand, the double-tunnel junctions for constituting the charge accumulation control circuits are constructed by asymmetrical junction parameters, so that the Coulomb staircase can be developed in the current-voltage characteristics, as follows:

$R_{13} > R_{18}$, $C_{13} \geq C_{18}$ (in tunnel junctions 13 and 18), $R_{131} > R_{181}$, $C_{131} \geq C_{181}$ (in tunnel junctions 131 and 181)     (42)

or $R_{13} > R_{18}$, $C_{13} \leq C_{18}$ (in tunnel junctions 13 and 18), $R_{131} < R_{181}$, $C_{131} \leq C_{181}$ (in tunnel junctions 131 and 181)     (43).

Under the conditions that the equations (42) and (43) are both satisfied, when voltages are applied to the gate electrodes 22 and 221 of the charge accumulation control circuits, if the absolute values $|V_{g1}|$ and $|V_{g2}|$ are lower than the Coulomb blockade voltages $V_{c2}$ and $V_{c3}$ respectively, the tunnelling is suppressed and no tunnel current flows therethrough. On the other hand, in the range where the absolute values $|V_{g1}|$ and $|V_{g2}|$ are higher than the Coulomb blockade voltages $V_{c2}$ and $V_{c3}$, respectively, the Coulomb staircase can be developed. For simplification, the case where the equation (43) is satisfied will be considered. In this case, the Coulomb blockade voltage becomes $V_{c2}=e/(2C_{18})$ and $V_{c3}=e/(2C_{181})$. In general, although the voltage steps $\Delta V_2$ and $\Delta V_3$ of the Coulomb staircase depend upon the junction parameters or the temperature, when the temperature satisfies the equation (40) sufficiently and further when the tunnel resistances of the double-tunnel junctions are different from each other extremely as $R_{18} \gg R_{13}$ and $R_{181} \gg R_{131}$, the voltage steps $\Delta V_2$ and $\Delta V_3$ of the Coulomb staircase can be given approximately as $\Delta V_2 = e/C_{18}$ $\Delta V_3 = e/C_{181}$     (44)

Here, the charge $n_2$ or $n_3$ accumulated on the island portion 16 or 162 of each of the respective double-tunnel junction circuits is quantized according to the applied voltage $V_{g1}$ or $V_{g2}$, as shown in FIG. 6. In this case, the following charges can be induced in the capacitors 17 and 171, respectively:

$Q_{g2} = (C_{g1}/C_\Sigma^{(2)}) e \cdot n_2$, $Q_{g2} = (C_{g2}/C_\Sigma^{(3)}) e \cdot n_3$.     (45)

Therefore, when an appropriate bias voltage $V_b$ is applied to the voltage application terminal 21 so that the conditions as expressed by the equation (17) can be satisfied, in the ideal case, $V_{out}$ becomes as expressed by the equation (18). Here, however, x is expressed as $$x = \frac{Q_{g1} + Q_{g2}}{e} - \left[ \frac{Q_{g1} + Q_{g2}}{e} + \frac{1}{2} \right] \quad (46)$$

where [a] is the greatest integer less than or equal to a.

Therefore, $V_{out}$ changes periodically in unit of the prime charge e according to an addition of $Q_{g1}$ and $Q_{g2}$ in the equation (46). As already explained in the third embodiment shown in FIG. 5, when $x_L$ and $x_H$ are determined appropriately, it is possible to allow the output within the range of $(-0.5 \leq x \leq x_L)$ to correspond to the "low-level" signal and the output within the range of $(x_H \leq x \leq 0.5)$ to correspond to the "high-level" signal, respectively. However, it is necessary to select the junction parameters in such a way that the output ranges can stay within the voltage step of Coulomb staircase $\Delta V_2$ or $\Delta V_3$ as given by the equation (44).

Here, in the same way as with the case of the third embodiment, $V_b$ and $R_1$ are rewritten as the equation (21). On the basis of the conditions as expressed by the equations (8), (41) and (17), it is sufficient that $\alpha = \gamma$ and $\gamma$ is determined as expressed by the equation (22). In this case, $V_{out}$ can be rewritten as the equation (23), so that the upper and lower limits of the low-level signal and the high-level signal can be determined as expressed by the equations (24) and (25).

Here, for simplification, the following case will be considered:

$C_{g1} = C_{g2} = C_g$, $C_{131} = C_{13}$, and $C_{181} = C_{18}$.     (47)

TABLE 4

| $Q_{g2}/e \backslash Q_{g1}/e$ | $C_{g1}/C_\Sigma^{(2)} \cdot n_2$ | $C_{g1}/C_\Sigma^{(2)} \cdot n_2'$ |
|---|---|---|
| $C_{g2}/C_\Sigma^{(3)} \cdot n_3$ | $X(C_{g1}/C_\Sigma^{(2)} \cdot n_2 + C_{g2}/C_\Sigma^{(3)} \cdot n_3)$ | $X(C_{g1}/C_\Sigma^{(2)} \cdot n_2' + C_{g2}/C_\Sigma^{(3)} \cdot n_3)$ |
| $C_{g2}/C_\Sigma^{(3)} \cdot n_2'$ | $X(C_{g1}/C_\Sigma^{(2)} \cdot n_2 + C_{g2}/C_\Sigma^{(3)} \cdot n_3')$ | $X(C_{g1}/C_\Sigma^{(2)} \cdot n_2' + C_{g2}/C_\Sigma^{(3)} \cdot n_3')$ |

Table 4 lists the values x to $Q_{g1}$ $Q_{g2}$, respectively. Here, the function $X(y)$ is defined as $X(y) = y - [y+1/2]$, where $[y+1/2]$ denotes the greatest integer less than or equal to $(y+1/2)$.

In more detail, Table 4 above indicates the values x given by the equation (46) when the charges stored on the island portions 16 and 162 of the second and third double-tunnel junction circuits for constituting the charge accumulation control circuit are $(n_2 \cdot e, n_3 \cdot e)$ or $(n_2' \cdot e, n_3', e)$ respectively.

According to FIG. 6. in order to obtain the charges stored on the island portions as described above, the following voltages $V_2$ and $V_3$ are inputted to the gate electrodes 22 and 221 of the second and third double-tunnel junction circuits, respectively:

$\Delta V_2 \cdot (n_2 - (1/2)) < V_2 < \Delta V_2 \cdot (n_2 + (1/2))$ $\Delta V_3 \cdot (n_3 - (1/2)) < V_3 < \Delta V_3 \cdot (n_3 + (1/2))$ or $\Delta V_2 \cdot (n_2' - (1/2)) < V_2 < \Delta V_2 \cdot (n_2' + (1/2))$ $\Delta V_3 \cdot (n_3' - (1/2)) < V_3 < \Delta V_3 \cdot (n_3' + (1/2))$ where $n_2$, and $n_2'$, $n_3$, and $n_3'$ are all an integer, respectively.

In accordance with these equations, the voltage corresponding to $n_2$ and $n_3$ are allowed to correspond to the "low-level" input signal and the voltage corresponding to $n_2'$ and $n_3'$ are allowed to correspond to the "high-level" input signal. In this example, since the capacitances of the second and third double-tunnel junctions are equal to each other, $\Delta V_2 = \Delta V_3$. Therefore, in order to use the same-level input signals for the second and third double-tunnel junction circuits, it is sufficient to choose as $n_2 = n_3 = n$ and $n_2' = n_3' = n$. By substituting the equation (44) into the above equations, the above equations can be rewritten as:

$$(e/C_{18})(n-(1/2)) < V_L < (e/C_{18})(n+(1/2)), \quad (48)$$

$$(e/C_{18})(n'-(1/2)) < V_H < (e/C_{18})(n'+(1/2)). \quad (49)$$

On the basis of the relationship between the equations (48) and (49) and the equations (24) and (25), respectively, the equations (28) to (31) similar to those of the third embodiment can be obtained.

In practice, a logical gate in which the following equations are satisfied is taken into account:

$$C_{131} = C_{13} = (11-3\beta)C_g, $$

$$C_{181} = C_{18} = 3(4+\beta)C_g, \quad (50)$$

$$(C_8/C_g) + (C_9 + C_g) = 2p,$$

$$(C_8/C_g) \cdot (C_9/C_g) = q (p, q > 0), \quad (51)$$

$$n' = n+3, \, n=5, 29, 53, \ldots \quad (52)$$

Here, since the situation that the equation (43) is established is considered, $\beta$ must lie within a range as $$(-1/6) \leq \beta < (11/3) \quad (53)$$

Under these conditions, since $C_{g1}/C_\Sigma^{(2)} = C_{g2}/C_\Sigma^{(3)} = 1/24$, Table 4 can be rewritten as

TABLE 5

| $Q_{g2}/e \backslash Q_{g1}/e$ | n/24 | (n + 3)/24 |
|---|---|---|
| n/24 | 10/24 | −11/24 |
| (n + 3)/24 | −11/24 | −8/24 |

Table 5 lists the values x to $Q_{g1}$ and $Q_{g2}$.
Here, $x_L$ and $x_H$ are selected as $$x_L = -7/24, \, x_H = 9/24. \quad (54)$$

Further, when the equations (28) to (31) are evaluated by substituting the equation (54) into the equations (24) and (25) and by use of the equations (15), (16), (19), (50) and (51), the following conditional equations with respect to p and q can be obtained as $$x_L = -7/24, \, x_H = 9/24. \quad (54)$$

Further, when the equations (28) to (31) are evaluated by substituting the equation (54) into the equations (24) and (25) and by use of the equations (15), (16), (19), (50) and (51), the following conditional equations with respect to p and q can be obtained as $$\frac{2n+5}{6(4+\beta)} \frac{1}{P} - \frac{\gamma}{1+\gamma} \frac{7}{8} \frac{1}{P(P+1)} \leq \frac{1}{q} \leq \quad (55)$$

$$\frac{2n+1}{6(4+\beta)} \frac{1}{P} - \frac{\gamma}{(1+\gamma)} \frac{5}{24} \frac{1}{P(P+1)}$$

$$q \leq p^2 \quad (56)$$

$$\frac{5}{8} \frac{\gamma(4+\beta)}{1+\gamma} < P+1 < \frac{\gamma(4+B)}{1+\gamma} \quad (57)$$

Therefore, when $\beta$, $\gamma$, p, q and n (=5, 29, 53, ...) are selected so that the above-mentioned conditions and the equation (22), (47) and (53) can be satisfied and further when the $V_L$ and $V_H$ given by the equation (48) and (49) are allowed to correspond to the high level (H) and the low level (L) of the input and output signals, respectively. The input and output levels of the device of the fourth embodiment as shown in FIG. 8 can be given by the following table 6:

TABLE 6

| $V_{g2} \backslash V_{g1}$ | L | H |
|---|---|---|
| L | H | L |
| H | L | L |

Table 6 lists the input and output levels of the single-electron double-tunnel junction logic gate of the fourth embodiment of the present invention. Therefore, the single-electron double-tunnel junction device as constructed above can operate as a NOR gate.

Here, when $\beta$, $\gamma$, p, q, and n are determined in practice as $\beta=1.5$; $\gamma=10$; and n=5, p and q which satisfy the equations (55) to (57) lie in a range as shown by oblique lines in FIG. 9. For instance, p=5 and q=24 lie within the oblique-line range. When $\beta$, $\gamma$, p, q and n are determined as described above, on the basis of the equations (50), (51) and (47), the capacitances of the tunnel junctions can be determined as $$C_8 = 4C_g, \, C_9 = 6C_g$$

$$(\text{or } C_8 = 6C_g, \, C_9 = 4C_g),$$

$$C_{g1} = C_{g2} = C_g,$$

$$C_{131} = C_{13} = C_g/2,$$

$$C_{181} = C_{18} = 45C_g/2.$$

$C_g$ is determined so as to satisfy the equation (40). On the other hand, the tunnel resistances of the tunnel junctions are selected so that the equations (9) (or (10)), (43) and (41) can be satisfied.

When the junction parameters of the single-electron tunnelling logic device are decided as described above, the logic device of this embodiment can operate as a NOR gate. Further, when a circuit composed of the load element 20 and the output terminal 10 is connected to a point 11 in FIG. 8, it is possible to operate this embodiment as an OR gate.

In the above-mentioned third embodiment, a one-input logic device has been explained, and in the above-mentioned fourth embodiment, a two-input logic device has been explained. Without being limited thereto, the present invention can construct a multi-input logic device. In this case, to the island portion of the first double-tunnel junction circuit for constituting an active circuit of Ohmic characteristics, the island portions of k-th (k=2, 3, ...) double-tunnel junction circuits are connected via a capacitor, respectively, as shown in FIG. 10.

In FIG. 10, reference numerals 192 to 19k denote charge accumulation control circuits constructed by the k-th (k=2, 3, ...) double-tunnel junction circuits of Coulomb staircase characteristics. Each of these charge accumulation control circuits 193 to 19k is the same in construction as the control circuit 192.

As already explained in the third and fourth embodiments, it is possible to obtain a predetermined logical operation result between the input voltage signals $V_{g1}$ to $V_{g(k-1)}$ and the output signal $V_{out}$, by setting the tunnel junction capacitances $C_8$ and $C_9$ and the tunnel resistances $R_8$ and $R_9$ of the double-tunnel junction circuit constituting the active circuit of Ohmic characteristics, and further by setting the tunnel junction capacitances $C_{130}$, $C_{131}$, ... $C_{13(k-2)}$, $C_{18}$, $C_{181}$, ..., $C_{18(k-2)}$, and the tunnel resistances $R_{130}$, $R_{131}$, ..., $R_{13(k-2)}$, and $R_{18}$, $R_{181}$, ..., $R_{18(k-2)}$ of the second to k-th double-tunnel junction circuits 192 to 19k, respectively.

Finally, the device structure and the manufacturing method of the first embodiment according to the present invention will be described hereinbelow with reference to the attached drawings.

FIGS. 11(a) and 11(b) show a device structure of the A-SET according to the present invention.

First, as shown in FIG. 11(b), a high purity InAs layer 32 is formed by epitaxial growth on a semi-insulating bulk InAs substrate in accordance with MBE or MOCVD method. Then, a $Ga_xIn_{1-x}As$ barrier layer 33 having a thickness of about 6 to 10 nm and including impurity additive is formed by epitaxial growth in accordance with MBE or MOCVD method. After that, an n-$Ga_xIn_{1-x}As$ layer 34 including Sn as donor impurities is grown. Here, it is preferable that the mixed crystal ratio x of $Ga_xIn_{1-x}As$ is more than 0.5. Further, it is of course possible to use any donor types to the $Ga_xIn_{1-x}As$ other than Sn as the impurities of the n-$Ga_xIn_{1-x}As$ layer 34. In the hetero-interface between the InAs layer 32 and the $Ga_xIn_{1-x}As$ layer 33 formed as described above, a two dimensional electron gas system is formed.

After that, a first metallic gate electrode 35 as shown in FIG. 11(a) is formed on the upper portion of the n-$Ga_xIn_{1-x}As$ layer 34, and further a second gate electrode 37 and a third gate electrode 38 are formed via a silicon oxide film 36. Here, it is possible to first form an n-InAs layer doped by donor-type impurities such as Te on the n-$Ga_xIn_{1-x}As$ layer 34 and then to form the first gate electrode 35 thereon. Further, it is also possible to form the third gate electrode 38 on a silicon oxide film formed on the second gate electrode 37. In this case, there exists no problem even if the edges of the third gate electrodes 38 are overlapped with the second gate electrode 37. Further, another insulating film can be used, instead of the silicon oxide film.

Further, it is possible to form a fine line-shaped conductive channel by depleting the two dimensional electron gas under control of the voltage applied to the first gate electrode 35. Further, it is possible to form barriers at the fine line-shaped conductive channel by controlling the voltage applied to the second gate electrode 37. The formed barriers function as a tunnel junction, and the region surrounded thereby corresponds to the island portion. Further, the tunnel resistance and the tunnel capacitance can be adjusted separately by controlling the voltages applied between the two second gate electrodes 37, respectively. By this, it is also possible to set the junction parameters thereof asymmetrically so that the Coulomb staircase can be obtained. Further, the third gate electrode 38 is provided to control the potential on the island portion, which corresponds to the gate electrode 7 of the A-SET shown in FIG. 1.

In above, in order to form the hetero-interface, a combination of InAs and $Ga_xIn_{1-x}As$ has been explained. Without being limited only thereto, various combinations, as GaAs and $Al_xGa_{1-x}As$, etc., can be used. Further, if the shape and the position of the first gate electrode are changed, it is also possible to utilize an inversion layer of Si and/or $SiO_2$ system as the two dimensional electron gas system. In addition, the shapes and the arrangements of the first, second and third gate electrodes are not limited to only those shown in FIG. 11(a). That is, as far as the fine line-shaped conductive channel and the tunnel barriers at a part of the channel can be formed, gate electrodes of any shape and arrangement can be used. For instance, the second and third gate electrodes of split type can be used in the same Way as with the case of the first gate electrode. Further, in the above-mentioned embodiment, although the tunnel capacitances and resistances of the tunnel junction are controlled through the gate electrodes, without being limited only thereto, it is possible to previously determine the respective tunnel junction parameters so that the double-tunnel junction becomes asymmetrical. For instance, it is possible to from the asymmetrical double-tunnel junction in such a structure as "metal-tunnel insulating film-metal".

Figure 12:
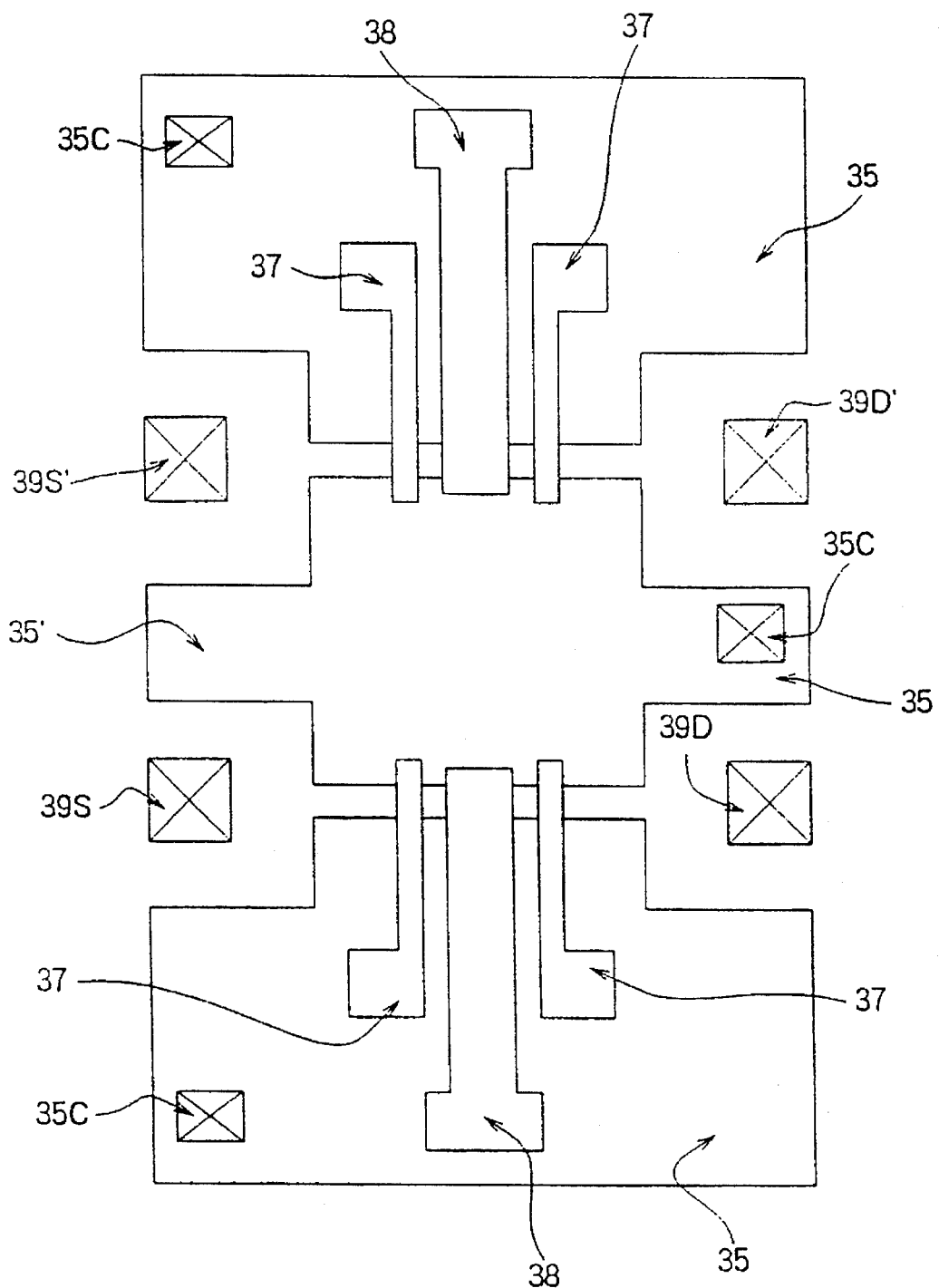
FIG. 12 is a plane view showing the device structure of the single-electron logic device related to the present invention shown in FIG. 5.
Figure 15:
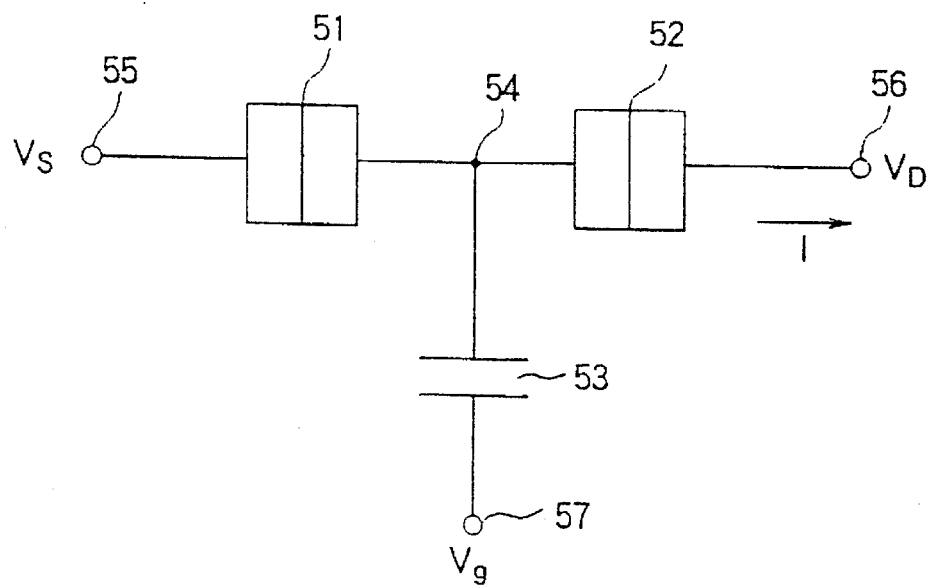
FIG. 15 is a circuit diagram showing the prior art single-electron transistor having a capacitance-coupled gate.
Figure 16:
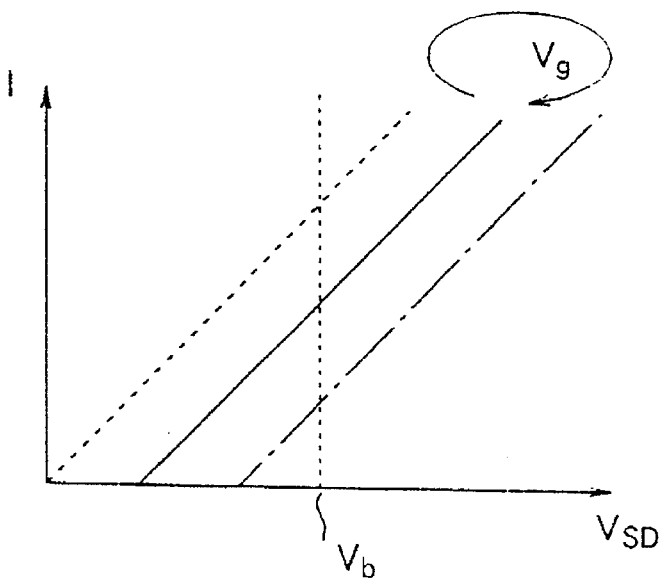
FIG. 16 is a graphical representation showing the I–$V_{SD}$ characteristics of the SET shown in FIG. 15, in which the gate bias is taken as a parameter.
Figure 17:
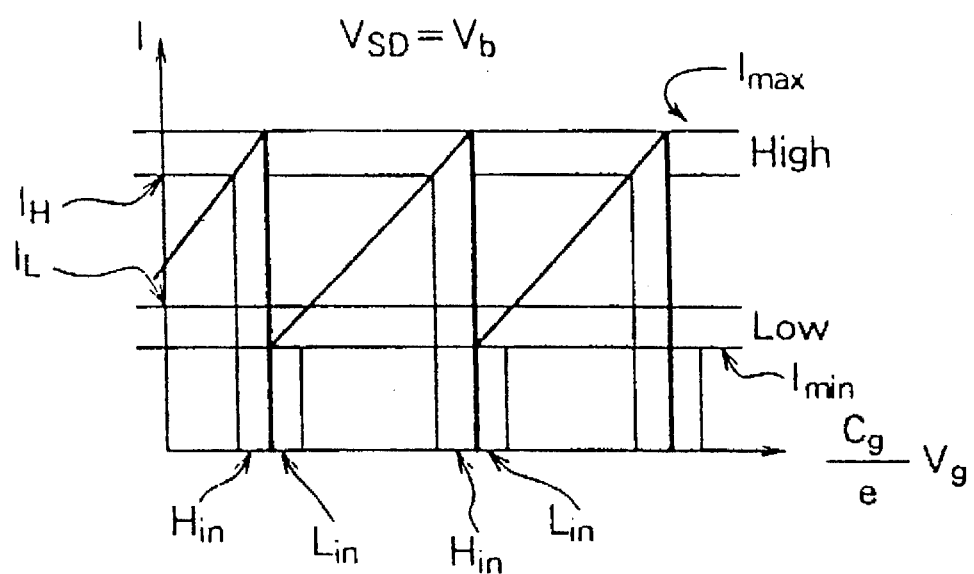
FIG. 17 is a graphical representation showing the I–$V_g$ characteristics of the SET shown in FIG. 15, in which $V_{SD}$ is fixed.

The fourth embodiment can be manufactured in the same way as above on the basis of the shape and arrangement of the gate electrodes as shown in FIG. 12. Here, however, the method of manufacturing the fourth embodiment through planar process will be described hereinbelow with reference to FIG. 13 and FIGS. 14(a) and (b). FIG. 13 is a plane view showing the fourth embodiment from above, and FIGS. 14(a) and (b) are cross-sectional views taken along the lines A–A' and B–B' in FIG. 13, respectively. Here, although not visible in practice, the portions 411 and 412 are shown in FIG. 14(a) and the portions 45 and 46 are shown in FIG. 14(b) for convenience.

First, after a metallic film is deposited on an insulating substrate 41, a resist is formed. The resist is exposed to a light or an electron beam to leave only fine line-shaped resist thereon. Further, a fine line-shaped metallic range 42 is formed by etching process. An insulating film 43 is formed all over the surface thereof. In order to make tunnel junction portions 44, a part of the formed insulating film 43 is bored and thinned at a position over the fine line-shaped metallic wire 42 by use of an electron beam or a focused ion beam. The area of the bore is 0.01 $\mu m^2$ or preferably less than this value. Further, two electrode wiring layers 45 and 46 are formed so as to cover these tunnel junction portions 44. After that, an insulating film 47 is deposited all over the surface thereof. By the above-mentioned process, one double-tunnel junction can be manufactured, and the fine line-shaped metallic region 42 becomes the island portion of the double-tunnel junction structure. The junction parameters such as the capacitance and resistance of the tunnel junction can be controlled by changing the size of the bore 44 at the tunnel junction portion and the film thickness thereof. After a metallic film has been deposited on the insulating film 47, a fine line-shaped metallic region 48 is formed between the already formed electrode wiring layers 45 and 46 by the etching processing in the direction different from the fine line-shaped metallic region 42, in the same method as with the case of the fine line-shaped metallic region 42. After that, the same process as with the case of the insulating film 43, the tunnel-junction portion 44, the electrode wiring layers 45 and 46 and the insulating film 47 is repeated. Further, an insulating film 49 is deposited; a tunnel junction portion 410; two electrode wiring layers 411 and 412 are formed; and an insulating film 413 is deposited. By the above-mentioned process, the second double-tunnel junction structure can be formed, and the fine line-shaped metallic region 48 becomes the island portion of the second double-tunnel junction. Here the junction parameters of the tunnel junction can be of course controlled to any desired values on the basis of the size of the bore formed in the tunnel junction portion 410 and the film thickness thereof. Two double-tunnel junction structures manufactured as described above are coupled capacitively each other between the two island portions thereof via the insulating film 47. The capacitance therebetween can be controlled by changing the thickness of the insulating film between the two electrode wiring layers 45 and 46.

Effect of the Invention

As described above, according to the present invention, since the charge accumulated on the island portion is controlled in such a way that the characteristics between the output voltage and the input voltage to the gate circuit represent the Coulomb staircase, it is possible to obtain square (Coulomb oscillation) characteristics between the input signal voltage and the output current, so that a constant output current value can be obtained belonging to a voltage range with constant width input signals. As a result, it is possible to increase the margin of the voltage value corresponding to the respective input logical levels. Therefore, it is possible to obtain a stable output according to the fluctuations of the input level signal by the effective utilization of the double-tunnel junction characteristics.

Further, even when the output current values corresponding to the high- and low-level outputs in the Coulomb oscillation characteristics are changed respectively, since the input voltage width can be maintained at a constant value, it is possible to widen the difference between the high- and low-level outputs, without reducing the voltage margin to the input logical level.

What is claimed is:

1. A single-electron tunnelling logic device, comprising:

a double-tunnel junction portion formed by connecting first and second single-electron tunnel junctions in series, a bias voltage being applied to both ends thereof; and a signal input portion connected to a common junction portion between said first and second single-electron tunnel junction portions via a capacitance element, wherein charge accumulated at the common junction portion is quantized approximately in integer-time unit of a prime charge according to the bias voltage;

wherein in said double-tunnel junction portion, a tunnel resistance $R_T^{(i)}$ and a junction capacitance $C_i$ of the i-th (i=1, 2) single-electron tunnel junction are so determined that any one of the following conditions can be satisfied:

$$R_T^{(1)} > R_T^{(2)},\ C_1 \geq C_2, \quad \text{(i)}$$

$$R_T^{(2)} > R_T^{(1)},\ C_2 \geq C_1 \quad \text{(ii)}.$$

2. A single-electron tunnelling logic device, comprising:

a double-tunnel junction portion formed by connecting first and second single-electron tunnel junctions in series, a bias voltage being applied to both ends thereof; and a signal input portion, connected to a common junction portion between said first and second single-electron tunnel junction portions via a capacitance element, wherein charge accumulated at another common junction portion between said signal input portion and the capacitance element is quantized approximately in integer-time unit of a prime charge according to an input voltage applied to said signal input portion;

wherein said signal input portion is a circuit formed by connecting first and second impedance elements in series, and further the common junction portion between the first and second impedance elements is connected to the capacitance element.

3. The single-electron tunnelling logic device of claim 2, wherein at least one of the first and second impedance elements is formed by a single-electron tunnel junction.

4. The single-electron tunnelling logic device of claim 3, wherein the first and second impedance elements are both formed by a single-electron tunnel junction, respectively, and these two single-electron tunnel junctions are different from each other in at least one of tunnel resistance and junction capacitance thereof.

5. A single-electron tunnelling logic device, comprising:

a double-tunnel junction portion formed by connecting first and second single-electron tunnel junctions in series, a bias voltage being applied to both ends thereof; and a signal input portion, connected to a common junction portion between said first and second single-electron tunnel junction portions via a capacitance element, wherein charge accumulated at another common junction portion between said signal input portion and the capacitance element is quantized approximately in integer-time unit of a prime charge according to an input voltage applied to said signal input portion;

wherein a plurality of the capacitance elements and a plurality of said signal input portions are connected to the common junction portion between said first and second single-electron tunnel junctions.

6. The single-electron tunnelling logic device of claim 4, wherein a tunnel resistance $R_T^{(1)}$ of the first impedance element and a junction capacitance $C_1$ of the first impedance element and a tunnel resistance $R_T^{(2)}$ of the second impedance element and a junction capacitance $C_2$ of the second impedance element are so determined that any one of the following conditions can be satisfied:

$$R_T^{(1)}C_1 > R_T^{(2)}C_2, \quad \text{(i)}$$

$$R_T^{(1)}C_1 < R_T^{(2)}C_2 \quad \text{(ii)}.$$

7. The single-electron tunnelling logic device of claim 6, wherein any one of the following conditions can be satisfied:

$$R_T^{(1)} > R_T^{(2)},\ C_1 \geq C_2, \quad \text{(i)}$$

$$R_T^{(1)} < R_T^{(2)},\ C_1 \leq C_2 \quad \text{(ii)}.$$

* * * * *